(12) United States Patent
Van Haaster

(10) Patent No.: US 6,320,120 B1
(45) Date of Patent: Nov. 20, 2001

(54) LOW PROFILE CLIP-ON SHIELDING STRIP

(75) Inventor: Phil Van Haaster, Corona, CA (US)

(73) Assignee: Laird Technologies, Delaware Water Gap, PA (US)

( * ) Notice: Subject to any disclaimer, the term of this patent is extended or adjusted under 35 U.S.C. 154(b) by 0 days.

(21) Appl. No.: 09/291,940

(22) Filed: Apr. 15, 1999

(51) Int. Cl.[7] .................................................. H05K 9/00
(52) U.S. Cl. ................... 174/35 GC; 174/35 R; 174/17 CT; 248/27.1; 361/808; 361/818; 361/821; 361/825
(58) Field of Search ................ 174/35 R, 35 GC, 174/35 TS, 40 CC, 51, 17 CT; 248/27.1, 27.3; 361/807, 809, 818, 819, 821, 825

(56) References Cited

U.S. PATENT DOCUMENTS

| | | | |
|---|---|---|---|
| 4,864,079 | * 9/1989 | Stickney | 174/35 GC |
| 5,204,496 | 4/1993 | Boulay et al. | 174/35 GC |
| 5,404,276 | 4/1995 | Hansson et al. | 361/821 |
| 5,569,877 | 10/1996 | Yumi | 174/35 GC |
| 5,647,748 | * 7/1997 | Mills et al. | 439/81 |
| 5,952,608 | * 9/1999 | Kim | 174/35 GC |
| 5,953,217 | * 9/1999 | Klein et al. | 361/799 |
| 5,957,465 | * 9/1999 | Gonsalves et al. | 277/637 |
| 6,054,648 | * 4/2000 | Hikita et al. | 174/35 R |
| 6,080,930 | * 6/2000 | Lommen et al. | 174/35 GC |
| 6,094,358 | * 7/2000 | Christensen et al. | 361/785 |
| 6,094,360 | * 7/2000 | Lange et al. | 361/799 |

OTHER PUBLICATIONS

Instrument Specialties Catalog, "RF Shielding Selection: A Guide to Interference Control," CAT–91, 1991.
BrushWellman Engineering Materials Brochure, "Guide to Beryllium Copper," pages 4 and 10, Apr. 1992.
Instrument Specialties Catalog, "Engineering Design and Shielding Product Selection Guide," pp. 62, 64 and 65, Apr. 1998.
Instrument Specialties Catalog, "Product Design and Shielding Selection Guide," pp. 59–66, Sep. 1994.

* cited by examiner

*Primary Examiner*—Dean A. Reichard
*Assistant Examiner*—Adolfo Nino
(74) *Attorney, Agent, or Firm*—Pitney, Hardin, Kipp & Szuch LLP

(57) ABSTRACT

A shielding and/or grounding strip includes a strip of material defining a first longitudinal side, a second longitudinal side, a top surface, and a mounting surface, with the first longitudinal side forming a hook member. At least one barb element extends from the mounting surface of the strip of material and at least one contact flap is formed on the mounting surface of the strip of material.

16 Claims, 4 Drawing Sheets

LOW PROFILE CLIP-ON SHIELDING STRIP

FIELD OF THE INVENTION

The present invention relates generally to electromagnetic interference (EMI)/radio frequency interference (RFI) shielding devices, and more specifically, to a low profile clip-on EMI/RFI shielding strip.

BACKGROUND OF THE INVENTION

As is well known, selected electric or electronic parts radiate electromagnetic waves which can cause noise or unwanted signals to appear in electric or electronic parts and devices existing in the vicinity of the radiating parts. Accordingly, it is highly desirable to provide shielding and/or grounding for electronic components that use circuitry that emits or is susceptible to electromagnetic radiation. It is known that these components can be shielded to reduce undesirable electromagnetic interference and/or susceptibility effects with the use of a conductive shield that reflects or dissipates the electromagnetic charges and fields. Such shielding may be grounded to allow the offending electrical charges and fields to be dissipated without disrupting the operation of the electronic components enclosed within the shield.

Various types of EMI/RFI shielding devices are known for reducing the transmission of EMI and RFI. Among the known devices are gaskets or strips of a resiliently deformable material which are secured to an openable access panel, door, drawer, or the like (hereinafter "door"), to block the transmission of EMI/RFI through the small clearance between the door and the adjacent structure which forms the opening into and out of which the door is movable. Such strips are useful for shielding openings of housings for electronic components which are highly sensitive to the adverse effects of EMI/RFI.

Such known devices are typically made of one of several materials which have the combined functions of acting as an EMI/RFI shield, and which are resiliently deformable so that they can be compressed between the door when closed, and will spring back to an uncompressed configuration when the door is moved out of the opening.

Prior shielding strips, although providing an adequate level of shielding for the electronic devices, are often difficult to install on an electronics housing and are often not secured to a mounting surface to withstand the forces generated in use without detaching from the surface. For example, one prior strip utilizes a track which is riveted to the mounting surface of the housing, the shielding strip then being slid onto the riveted track to hold the strip in place. Although providing a secure mount for the shielding strip, the riveted track involves a relatively complicated installation procedure, involving several steps, and is therefore labor intensive. Furthermore, a shielding strip which requires a riveted track is relatively expensive, because it requires extra parts (a track and rivets), and added labor to install. The riveted track is also somewhat prone to misinstallation, because installation requires alignment of a rivet with holes in the track.

Another prior shielding strip utilizes an adhesive layer on a portion of the shielding strip which is intended to be mounted on the electronics housing. Although being relatively simple to install, adhesive shielding strips also suffer from particular deficiencies. Specifically, adhesive tends to not be as strong as the riveted track shielding strips, discussed above. If a stronger adhesive is used, the probability of mismounting the adhesive shielding strip increases, requiring destruction of the adhesive shielding strip in order to properly place an adhesive shielding strip on a mounting surface.

Yet another prior shielding strip utilizes one or two long, continuous slots cut into the mounting surface, into which portions of the shielding strip are inserted. If two slots are provided, then the shielding strip is partially expanded, and the entire length of the shielding strip is partially inserted into the slots. The shielding strip is not locked in place, however, and is prone to displacement out of the slots. While providing a good level of shielding when the slots are properly machined, the requirement that precisely machined slots be formed in the mounting surface makes this type of shielding strip more expensive, labor intensive, prone to mismounting, and leads to a heightened potential for EMI/RFI leakage though the slot and past the strip if the slots are machined too wide or long.

There therefore remains a need in the art to provide an inexpensive shielding strip which is easily installed on a mounting surface, which does not require precision machining of the mounting surface, and which locks the shielding strip in place.

SUMMARY OF THE INVENTION

In order to overcome the problems and disadvantages of the prior art, the present invention provides a shielding and/or grounding strip including a strip of material defining a first longitudinal side, a second longitudinal side, a top surface, and a mounting surface. The first longitudinal side of the strip forms a hook member and at least one contact flap is formed on the mounting surface of the strip of material. In a preferred embodiment, a plurality of contact flaps are formed and the contact flaps may preferably have a semicircular shape.

Further, in accordance with a first embodiment of the present invention, at least one and preferably an opposing pair of barbs are provided for mounting the shielding strip. In a further embodiment of the present invention, pressure sensitive adhesive may be utilized for mounting the shielding strip.

Still other objects, features, and attendant advantages of the present invention will become apparent to those skilled in the art from a reading of the following detailed description of embodiments constructed in accordance therewith, taken in conjunction with the accompanying drawings.

BRIEF DESCRIPTION OF THE DRAWINGS

The invention of the present application will now be described in more detail with reference to preferred embodiments of the apparatus, given only by way of example, and with reference to the accompanying drawings, in which.

DESCRIPTION OF THE PREFERRED EMBODIMENTS

Figure 1:
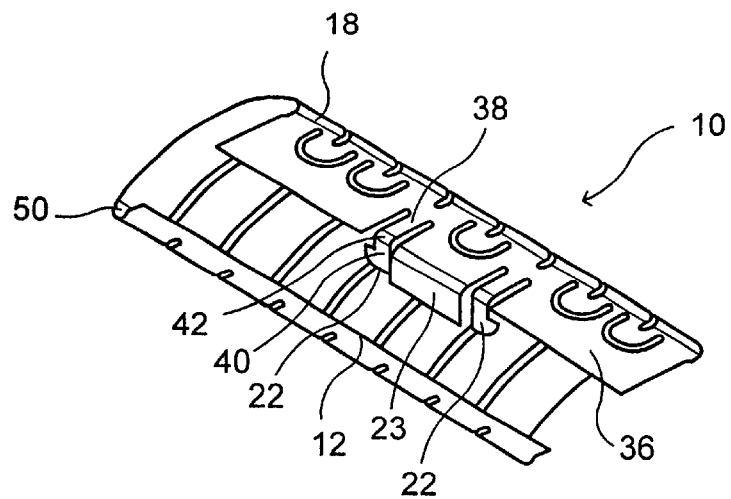
FIG. 1 is a bottom perspective view of a shielding strip according to the present invention.
Figure 2:
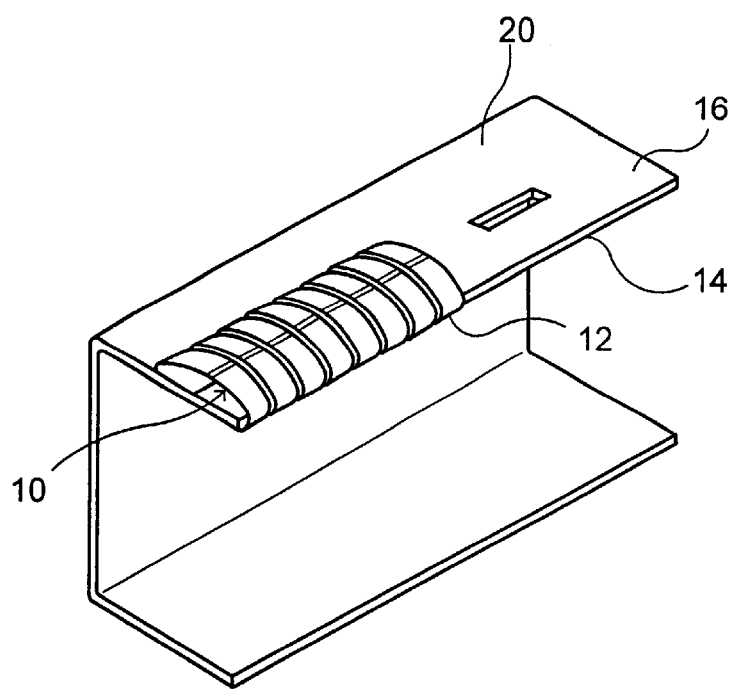
FIG. 2 is a top perspective view of the shielding strip illustrated in FIG. 1 as attached to a mounting surface.
Figure 3:
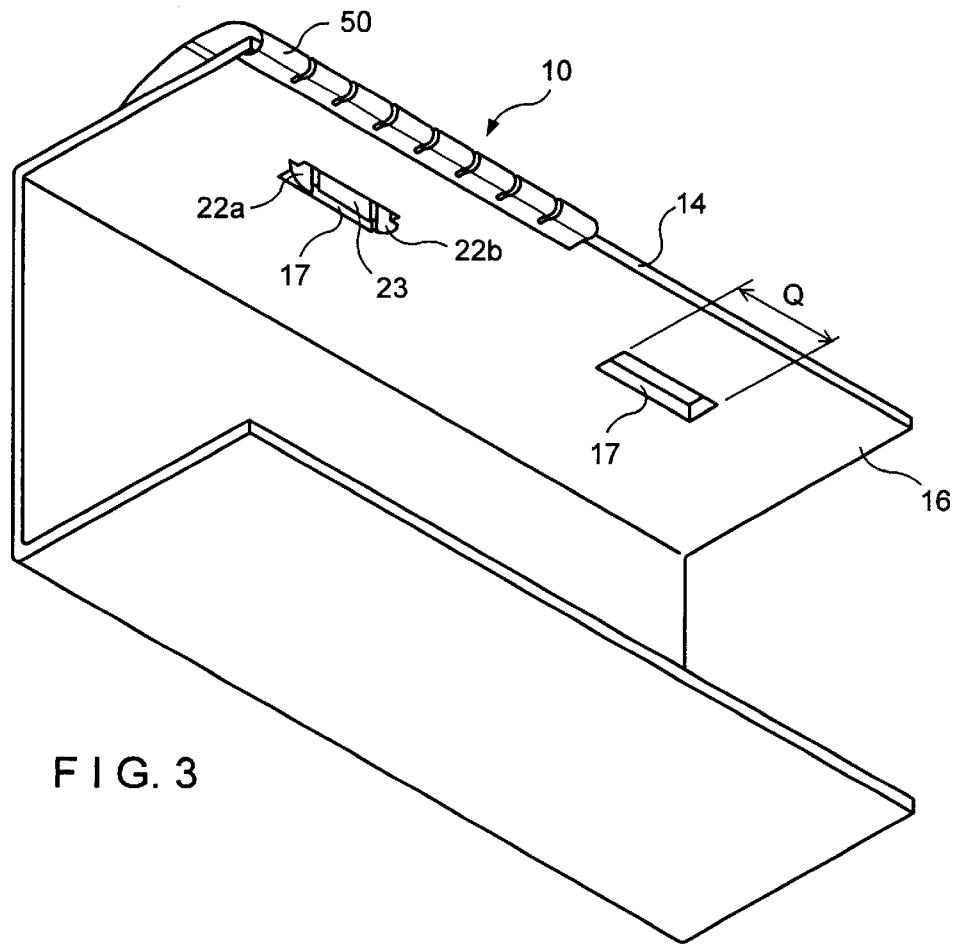
FIG. 3 is a bottom perspective view of the shielding strip illustrated in FIG. 1 when attached to the mounting surface as shown in FIG. 2.

Referring to FIG. 1, a low profile clip-on shielding and/or grounding strip in accordance with a first embodiment of the present invention is shown generally by reference numeral 10. Hereinafter, shielding and/or grounding strip 10 will be referred to as shielding strip 10; however, it is to be understood that shielding strip 10 may be used as a grounding strip as well. As shown in FIG. 2, shielding strip 10 includes a first longitudinal side 12 configured to form a hook or clip 50 which mounts onto or around an edge 14 of a mounting surface 16 and a second longitudinal side 18 configured to be mounted on an upper surface 20 of the mounting surface 16. Referring also to FIG. 3, shielding strip 10 further includes at least one barb element 22, and depending upon the length of the shielding strip, a plurality of cooperating barb elements 22a, 22b, located along the length of the shielding strip along the second longitudinal side 18. Barb elements 22a, 22b are preferably spaced apart along the length of the shielding strip 10 when there are a plurality of barb elements provided. The barb elements assist in holding the shielding strip 10 in place on a mounting surface as will be described in greater detail below, and eliminate the need for extraneous and separate components to attach the shielding strip to a mounting surface.

Figure 4:
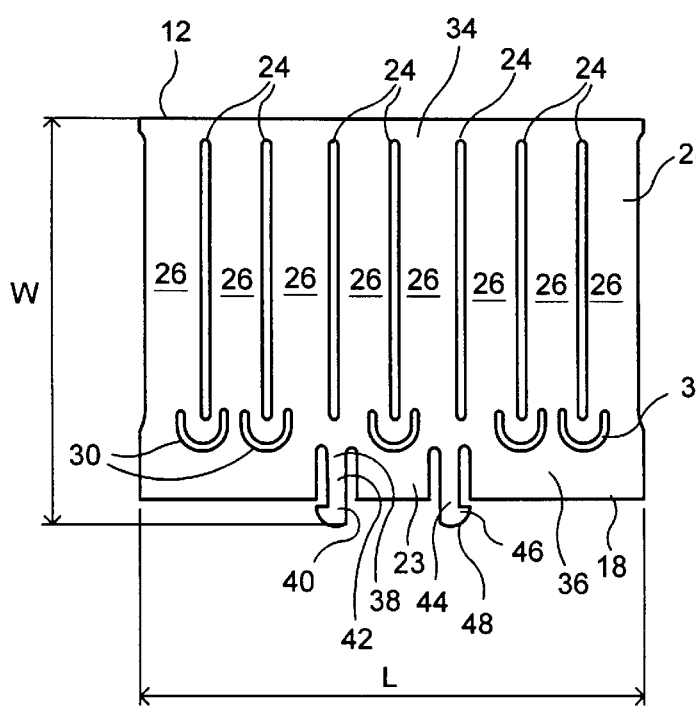
FIG. 4 is a plan view of the shielding strip blank prior to forming.

FIG. 4 illustrates a flat blank 28 for forming shielding strip 10. As shown, shielding strip 10 includes a plurality of slots 24 which define finger elements 26 therebetween and on each longitudinal end. The slots 24 allow the finger elements 26 to flex outwardly and move independently, as will be described in greater detail below. The slots 24 do not extend entirely across the width of the shielding strip 10 such that a solid margin 34, 36 is formed along each longitudinal side 12, 18. The solid margin 34, 36 along each side provides a continuous length of material along the length of shielding strip 10 and provides added rigidity to the shielding strip. Each of the barb elements 22a, 22b include an upper leg portion 38 disposed within the solid margin 36, a lower leg portion 40 which is inserted through the mounting surface hole 17, and a middle curved portion 42 extending therebetween. The lower leg portion 40 of each of the barb elements is further defined by a straight portion 44 and an enlarged head portion 46 having a curved surface 48 to assist in guiding the barb element into the mounting surface hole. The enlarged head portions 46 of the barb elements lock onto the edges of the mounting surface hole 17 when inserted therethrough to provide for secure retention, of the shielding strip on the mounting surface. As shown, a flap 23 may also be defined between the pair of barb elements 22a, 22b and bent to extend through the mounting surface hole 17.

Shielding strip 10 further includes at least one and, depending upon the length of the shielding strip, a plurality of contacts 30, which are preferably formed as semi-circular details about the base of a respective slot 24. The contacts 30 thus form "flaps" which will be deflected upon application of a force to the shielding strip, as further described below. Although not shown, other shapes of contact flaps may also be used in accordance with the present invention such as, for example, triangular, rectangular, tear drop, and the like, the requisite shape merely having to form a flap capable of being deflected and contacting the mounting surface.

Figure 5:
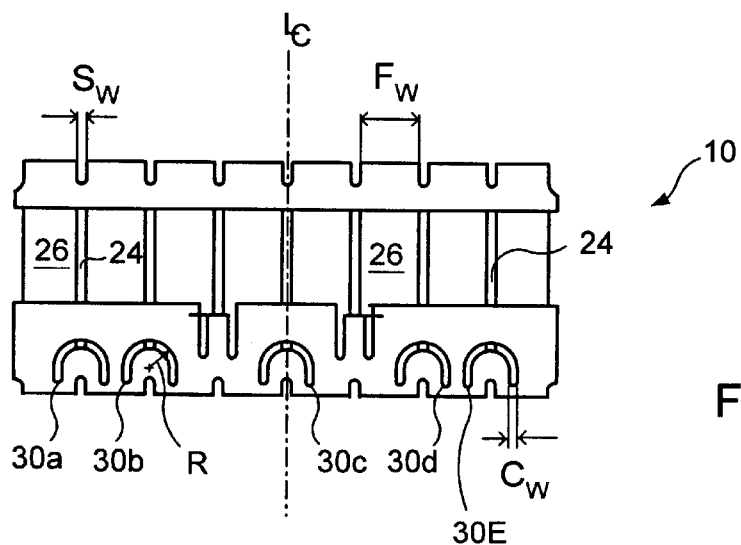
FIG. 5 is a bottom plan view of the shielding strip shown in FIG. 1.
Figure 6:
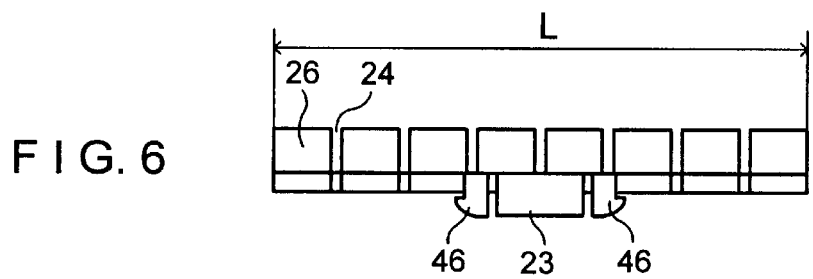
FIG. 6 is a side elevational view thereof.

Referring also to FIG. 5, according to the illustrated embodiment of the present invention, shielding strip 10 includes seven slots 24 having a width $S_w$ of approximately 0.022 in., thereby forming eight finger elements 26 having a width $F_w$ of approximately 0.153 in. The contacts 30 are formed with a width $C_w$ of approximately 0.020 in. and a radius of curvature R of approximately 0.050 in. by removing the blank material in a semi-circular pattern. As shown in FIG. 4, five contacts are formed on the shielding strip 10 having a length "L" of 1.4 in. and a width "W" of 1.131 in. As should be apparent to one skilled in the art, the number of contacts 30 may be varied depending upon the length of the shielding strip and the desired shielding effectiveness. Alternate embodiments of the shielding strip of the present invention may, for example, only include the two outer contacts on each side of the center line "CL", $30_a$, $30_b$, $30_d$, $30_e$, and not the central contact, $30_c$. Further, an alternate embodiment of the present invention may only include two contacts, one on each side of the centerline CL, such as $30_b$ and $30_d$ for example. Still further, an alternate embodiment may provide seven contacts on the shielding strip, one contact being formed for each of the corresponding slots 24. The above given dimensions are preferred for use of the shielding strip on a mounting surface having a thickness of 0.05 in. If a mounting surface having a different thickness is used, for example, 0.040–0.125 in., it should be clear to one skilled in the art that the dimensions of the shielding strip may be varied accordingly in order to achieve the desired contact.

Shielding strip 10 is preferably formed of a springy, and more preferably, electrical conductive material. By the term springy it is meant that the material out of which shielding strip 10 is formed is elastic in nature, with a modulus of elasticity sufficient so that the shielding strip 10 and/or the finger elements 26 and/or the contacts 30 can be displaced by a force from an unloaded position to a loaded position, and will return to the unloaded position upon the removal of this force, without exceeding the yield point of the material. By electrically conductive it is meant that the material out of which shielding strip 10 is constructed is capable of conducting electricity therethrough and has an impedance low enough that it is an effective EMI/RFI shield. Preferably, the material out of which shielding strip 10 is formed is a beryllium copper alloy or stainless steel. A more preferable beryllium copper alloy is composed of between about 1.8% (weight) and about 2.0% (weight) beryllium, a maximum of about 0.6% (weight) of the combination of cobalt, nickel, and iron, and the balance copper, which alloy has an electrical conductivity of between about 22% and about 28%IACS (International Annealed Copper Standard). One suitable alloy is available from Brush Wellman, Cleveland, Ohio, as Brush Alloy 25 (copper alloy UNS number C17200).

Other suitable materials include phosphor bronze, copper-clad steel, brass, monel, aluminum, steel, nickel silver, and other BeCu alloys. Furthermore, the material can optionally be pre- or post-plated for galvanic compatibility with the surface on which it is intended to be mounted. Alternatively, the material can be a molded or cast polymer, preferably loaded or coated to be electrically conductive.

Figure 7:
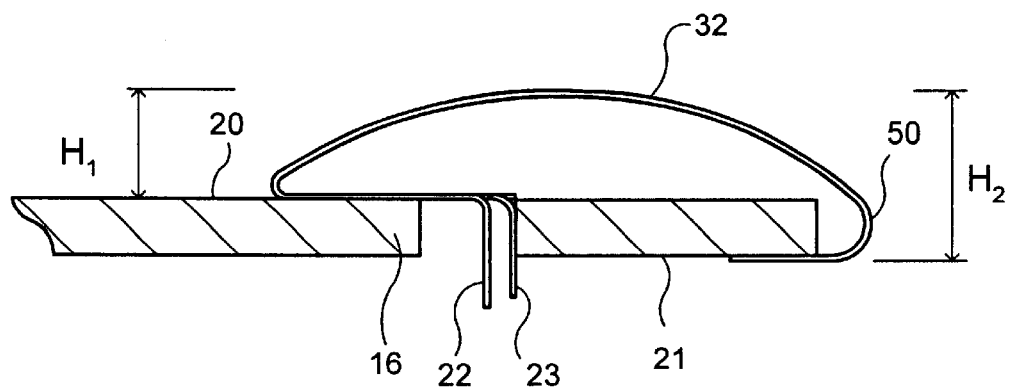
FIG. 7 is a cross section of the shielding strip shown in FIG. 1.

Turning also now to FIG. 7, which illustrates a cross section of the shielding strip 10, one preferred embodiment of the present invention is presented in detail. Shielding strip 10 includes finger elements 26 which define a top portion 32 of the shielding strip having a predetermined radius of curvature, preferably 0.40 in. or 0.45 in. In accordance with the present invention, the height "$H_1$" of the top portion 32 from a plane of the upper surface 20 of the mounting surface 16 is no more than approximately 0.150, preferably, no more than 0.130, and most preferably, no more than approximately 0.119 in. The height "$H_2$" of the top portion 32 from a plane of the lower surface 21 of the mounting surface 16 where the clip element 50 hooks on the mounting surface is no more than approximately 0.200, preferably, no more than 0.180, and most preferably, no more than approximately 0.169 in. The shielding strip 10 thus attains a lower overall profile than prior shielding strips without compromising shielding effectiveness due at least in part to the presence of contacts 30. As set forth above, these given dimensions are preferred for use of the shielding strip on a mounting surface having a thickness of 0.05 in. If a mounting surface having a different thickness is used, for example, 0.040–0.125 in., it should be clear to one skilled in the art that the dimensions of the shielding strip may be varied accordingly in order to achieve the desired contact.

As best illustrated in FIG. 1, the margin portion 36 adjacent the barb elements 22a, 22b is preferably formed as an inward facing flange which provides a bearing surface for each finger element against the upper surface 20 of the mounting surface 16.

The function of the shielding strip 10 will now be described with reference to the drawing figures. When it is desired to mount a shielding strip 10 to a mounting surface 16 which includes at least one mounting surface hole 17, the shielding strip is positioned adjacent to the upper surface 20 of the mounting surface with barb elements 22a, 22b positioned immediately adjacent to mounting surface hole 17. The curved surface 48 of each of the lower leg portions 40 are then inserted into mounting surface hole 17, followed by lower leg portion 40 of the barb. In the event that mounting surface hole 17 has a dimension Q which is smaller than the tip to tip distance between the enlarged heads 46 of barbs 22a, 22b, shielding strip 10 is further pushed down into mounting surface hole 17 to cam lower leg portions 40 of the barbs toward one another, thus allowing the barb elements to proceed into the mounting surface hole. Once inserted into the mounting surface hole, the lower leg portions of the barb elements begin to return to their prestressed unloaded positions, thereby locking the enlarged head 46 against the lower surface 21 of the mounting surface 16, as best shown in FIG. 3. The locking of the heads 46 thus prevent retraction of the barbs 22a, 22b, and therefore the shielding strip 10, back through the mounting surface hole. The mechanical mounting thus obtained by the present invention obtains a secure retention of the shielding strip and offers no loss of attenuation at high frequencies which was typical of prior slot mounted gaskets. The present invention is also advantageous in that the barb elements 22a, 22b may be spaced to be received within the tracks of existing slot mounted gaskets, thus providing an easily installed retro-fit shielding application. Alternative to the mounting surface hole 17 shown in FIG. 3 which receives both barb elements 22a and 22b, it is also within the scope of the present invention to provide a separate mounting hole for each barb element if no flap 23 is provided. In such instance, barb element 22a would be disposed through a first mounting hole and barb element 22b would be disposed through a second mounting hole.

Shielding strip 10 is now ready to be used as a shielding and/or grounding strip, by contact with another surface (not illustrated) which would bear against finger elements 26 and top portion 32 with a force which has a component perpendicular to a longitudinal axis of the shielding strip. Due to the low profile of shielding strip 10, a low compression force on the order of 5 lb/linear ft. is all that is required to obtain sufficient deflection of the shielding strip. When shielding strip 10 is in use, finger elements 26 and top portion 32 are borne against by another surface, which causes finger elements 26 to flex along their length, thus bringing top portion 32 closer to mounting surface 16 and causing contact flaps 30 to deflect and increase the contact area. The unique semi-circular shape of the contacts 30 allows for a moment force to be induced at the radius between the top portion 32 and the solid margin 36, which radius is preferably formed at 0.010 in., although other dimensions could of course also be used depending on the desired contact. The moment force will assist the deflection of the semi-circular contacts 30 against the top surface of the mounting surface. During such use, the enlarged heads 46 of the barbs 22a, 22b remain locked outside of mounting surface hole 17, thereby ensuring that shielding strip 10 will not be displaced from the mounting surface. When the loading surface is removed from being in contact with shielding strip 10, the resilient nature of the material out of which shielding strip 10, and particularly contacts 30 and finger elements 26, is constructed causes finger elements 26 and contacts 30 to return to their unloaded position. The material out of which shielding strip 10 and barb elements 22a, 22b are constructed is selected so that during insertion of the barbs into mounting surface hole 17 and in the use of shielding strip 10 as a shielding and/or grounding strip, the yield point of the material is not reached, i.e., no plastic deformation of the material occurs.

Figure 8:
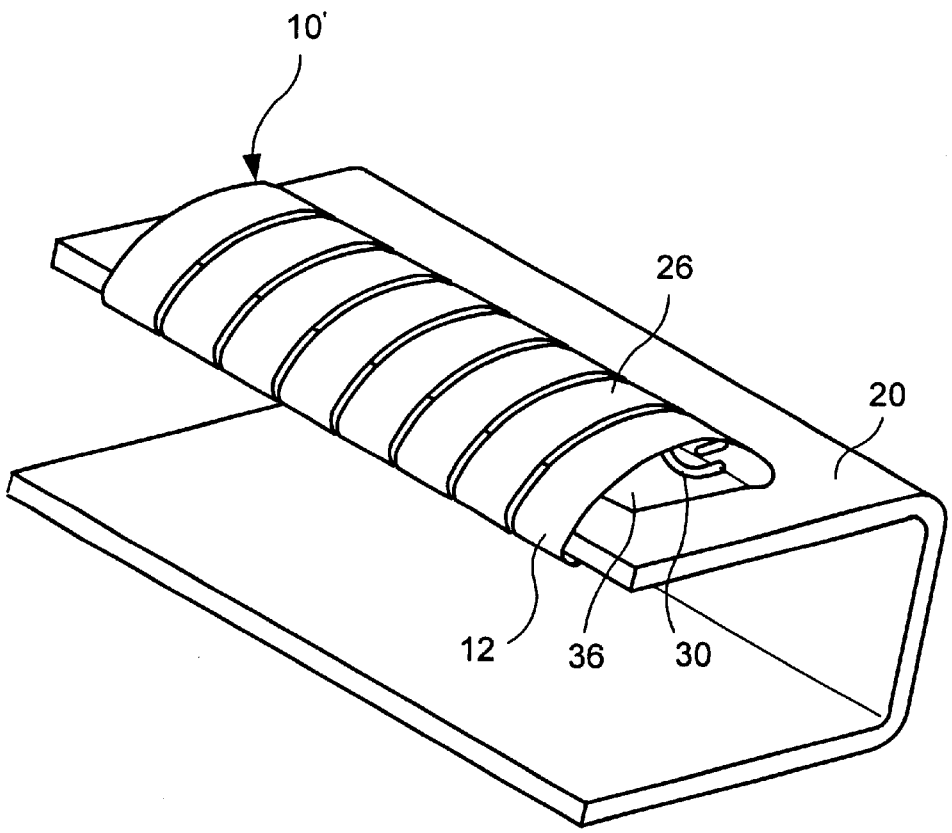
FIG. 8 is a perspective view of a shielding strip according to a further embodiment of the present invention as attached to a mounting surface.
Figure 9:
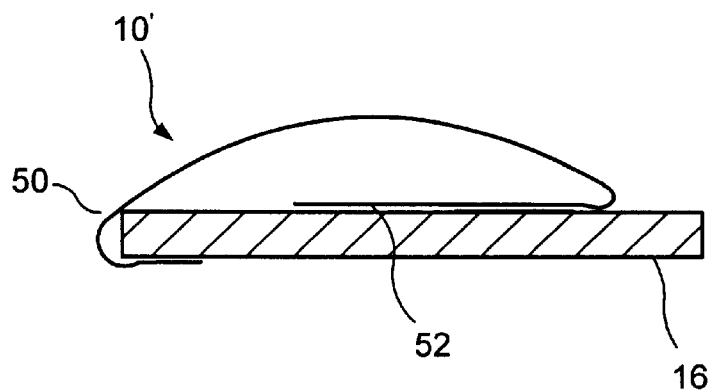
FIG. 9 is a cross section of the shielding strip shown in FIG. 8.

Referring now to FIGS. 8 and 9, a further embodiment of the present invention is illustrated by shielding strip 10'. Shielding strip 10' is formed in a similar manner as described above with respect to shielding strip 10, except that barbs 22a, 22b are not present. Rather, shielding strip 10' utilizes a pressure sensitive adhesive (PSA) 52 to maintain the margin portion 36 on the upper surface 20 of the mounting surface. The PSA forms a non-conductive barrier along the innermost edge of the margin 36. However, the contact flaps 30, when deflected, will provide points of contact outside the area to which the PSA is applied. The longitudinal side 12 of shielding strip 10' is configured to form a clip or hook 50 which extends around the edge of the mounting surface, as described above. Thus, the clip or hook 50 and the PSA applied to shielding strip 10' obtain a secure retention of the shielding strip 10' on the mounting surface 16.

As will be readily appreciated by one of ordinary skill in the art, the specifications and descriptions given herein merely represent one exemplary embodiment of a shielding strip in accordance with the present invention, and all of the given dimensions may be changed to tailor the size and mechanical characteristics of the shielding strip and barb elements and clip for other specific environments, without departing from the spirit and scope of the present invention. Furthermore, while the invention has been described in detail with reference to preferred embodiments thereof, it will be apparent to one skilled in the art that various changes can be made, and equivalents employed, without departing from the scope of the invention.

I claim:

1. A shielding and/or ground strip comprising:
   a strip of material defining a first longitudinal side, a second longitudinal side, a top surface, and a mounting surface having a first end and a second end, said first longitudinal side forming a first hook member and said second longitudinal side forming a second hook member, wherein said first end of said mounting surface is connected to said second hook member and said second end of said mounting surface extends in a direction generally towards said first hook member;

at least one barb element extending from the second end of said mounting surface of said strip of material; and at least one contact flap formed on the mounting surface of said strip of material.

2. A shielding and/or grounding strip in accordance with claim 1, wherein said at least one barb element is a pair of cooperating barb elements.

3. A shielding and/or grounding strip in accordance with claim 1, wherein said at least one contact flap is a plurality of contact flaps.

4. A shielding and/or grounding strip in accordance with claim 1, wherein said at least one contact flap has a semi-circular shape.

5. A shielding and/or grounding strip in accordance with claim 1, wherein said top surface includes a plurality of resilient finger elements.

6. A shielding and/or grounding strip in accordance with claim 1, wherein said strip is formed of a material selected from the group consisting of a beryllium copper alloy, phosphor bronze, copper-clad steel, brass, monel, aluminum, steel, stainless steel, and nickel silver.

7. A shielding and/or grounding strip comprising:

a strip of material defining a first longitudinal side, a second longitudinal side, a top surface, wherein said first and second longitudinal sides are located on opposite ends of said top surface, and a mounting surface having a first end and a second end, said first and second longitudinal sides respectively forming first and second hook members;

said first end of said mounting surface being connected to said second hook member and said second end extending in a direction generally towards said first hook member;

said first hook member having a larger radius of curvature than said second hook member, said first hook member being configured to overlap an edge of a mounting element and said mounting surface being configured to rest on a top surface of said mounting element when said first hook member is in overlapping configuration with said edge; and at least one contact flap formed on the mounting surface of said strip of material.

8. A shielding and/or grounding strip in accordance with claim 7, wherein said at least one contact flap is a plurality of contact flaps.

9. A shielding and/or grounding strip in accordance with claim 7, wherein said at least one contact flap has a semi-circular shape.

10. A shielding and/or grounding strip in accordance with claim 7, wherein said top surface includes a plurality of resilient finger elements.

11. A shielding and/or grounding strip in accordance with claim 7, wherein said mounting surface includes a pressure sensitive adhesive.

12. A shielding and/or grounding strip in accordance with claim 7, wherein said mounting surface includes at least one element extending therefrom.

13. A shielding and/or grounding strip for use on a mounting element having an upper surface, a lower surface, and an edge, said shielding and/or grounding strip comprising:

a strip of material defining a first longitudinal side, a second longitudinal side, a top portion, and a mounting portion having a first end and a second end, said first longitudinal side forming a first hook member configured to extend around the edge of the mounting element, and said second longitudinal side forming a second hook member, and said mounting portion being adapted for mounting on the upper surface of the mounting element;

said first end of said mounting portion being connected to said second hook member and said second end of said mounting portion extending in a direction generally towards said first hook member;

at least one barb element extending from the second end of the mounting portion of said strip of material; and at least one contact flap formed on the mounting portion of said material, said at least one contact flap being disposed on the upper surface of the mounting element when said shielding and/or grounding strip is mounted on the mounting elements.

14. A shielding and/or grounding strip in accordance with claim 13, wherein said at least one contact flap is a plurality of contact flaps.

15. A shielding and/or grounding strip in accordance with claim 13, wherein said at least one contact flap has a semi-circular shape.

16. A shielding and/or grounding strip in accordance with claim 13, wherein said at least one barb element is configured for insertion through a mounting hole provided in the mounting element.

\* \* \* \* \*